US00RE39538E

(19) United States
(12) Reissued Patent
Bauer et al.

(10) Patent Number: US RE39,538 E
(45) Date of Reissued Patent: Apr. 3, 2007

(54) SURFACE ACOUSTIC WAVE ARRANGEMENT WITH A JUNCTION REGION BETWEEN SURFACE ACOUSTIC WAVE STRUCTURES HAVING A DECREASING THEN INCREASING FINGER PERIOD

(75) Inventors: Thomas Bauer, München (DE); Günter Kovacs, München (DE); Ulrike Rösler, Hebertshausen (DE); Werner Ruile, München (DE)

(73) Assignee: EPCOS AG (DE)

(21) Appl. No.: 10/890,553

(22) PCT Filed: Oct. 26, 1999

(86) PCT No.: PCT/EP99/08074

§ 371 (c)(1),
(2), (4) Date: Apr. 27, 2001

(87) PCT Pub. No.: WO00/25423

PCT Pub. Date: May 4, 2000

Related U.S. Patent Documents

Reissue of:
(64) Patent No.: 6,420,946
Issued: Jul. 16, 2002
Appl. No.: 09/830,622
Filed: Apr. 27, 2001

(30) Foreign Application Priority Data

Oct. 28, 1998 (DE) ..... 198 49 782

(51) Int. Cl.
*H03H 9/145* (2006.01)
*H03H 9/64* (2006.01)

(52) U.S. Cl. ..... 333/193; 333/195; 310/313 B; 310/313 D

(58) Field of Classification Search ..... 333/193–196, 333/150–154; 310/313 R, 313 B, 313 C, 310/313 D See application file for complete search history.

(56) References Cited

U.S. PATENT DOCUMENTS

| | | | | |
|---|---|---|---|---|
| 4,837,476 A | * | 6/1989 | Mochizuki | 310/313 R |
| 5,256,927 A | * | 10/1993 | Kato et al. | 310/313 B |
| 5,336,957 A | | 8/1994 | Yamanouchi et al. | 310/313 D |
| 6,353,372 B1 | | 3/2002 | Baier et al. | 333/195 |

FOREIGN PATENT DOCUMENTS

| | | | |
|---|---|---|---|
| DE | 41 26 335 | * | 2/1993 |
| DE | 42 12 517 | * | 10/1993 |
| DE | 195 16 903 | | 3/1997 |
| DE | 197 24 258 | | 12/1998 |
| DE | 197 24 259 | | 12/1998 |
| EP | 0 579 871 | * | 1/1994 |
| GB | 2 160 048 | * | 12/1985 |
| JP | 62-256512 | * | 11/1987 |
| JP | 10-335966 | * | 12/1988 |
| JP | 08-008690 | | 1/1996 |
| JP | 8-330898 | * | 12/1996 |
| JP | 2620085 | | 3/1997 |
| JP | 11-88112 | * | 3/1999 |

OTHER PUBLICATIONS

Ebata, "Suppression of Bulk–Scattering Loss in SAW Resonator with Quasi–Constant Acoustic Reflection Periodicity", *1988 IEEE Ultrasonic Symposium*, vol. 1, pp. 91–96 October 1988.*

* cited by examiner

*Primary Examiner*—Barbara Summons
(74) *Attorney, Agent, or Firm*—Schiff Hardin LLP

(57) ABSTRACT

In order to reduce scattering losses during the transmission of a surface acoustic wave signal, a surface acoustic wave arrangement has a junction between two mutually offset surface acoustic wave structures designed so that the finger period is reduced in the region of the junction, and varies continuously in the region of the junction.

30 Claims, 3 Drawing Sheets

FIG 3
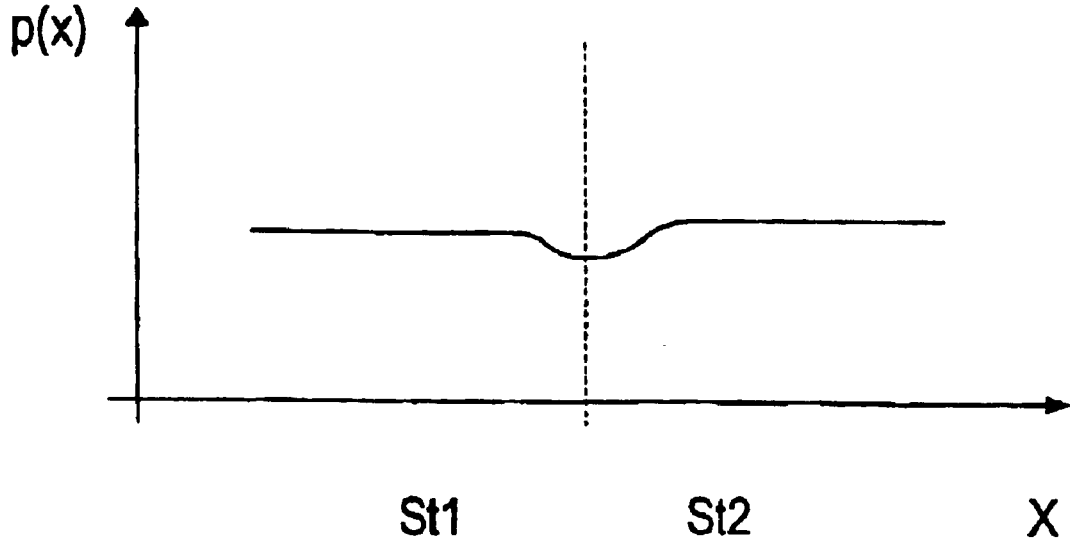
FIG 4 a
(PRIOR ART)
FIG 4b
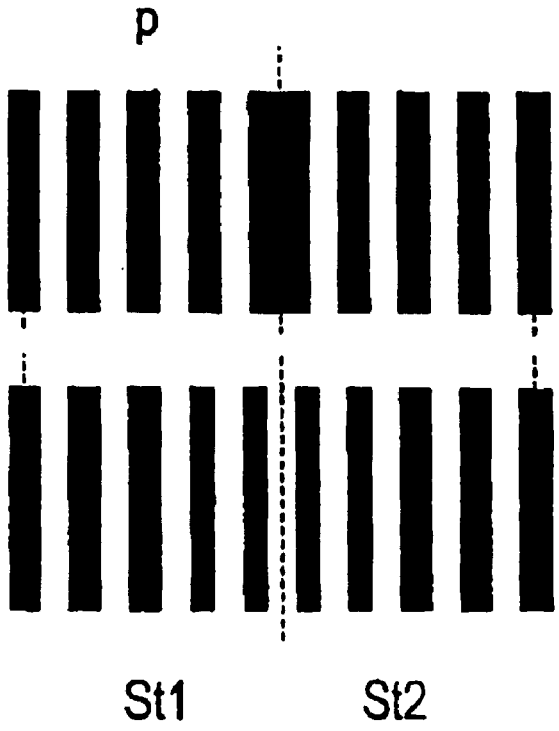

SURFACE ACOUSTIC WAVE ARRANGEMENT WITH A JUNCTION REGION BETWEEN SURFACE ACOUSTIC WAVE STRUCTURES HAVING A DECREASING THEN INCREASING FINGER PERIOD

Matter enclosed in heavy brackets [ ] appears in the original patent but forms no part of this reissue specification; matter printed in italics indicates the additions made by reissue.

The invention relates to surface acoustic wave arrangements having at least two surface acoustic wave structures which are adjacent in the main wave propagation direction and in which the period of the fingers in the first surface acoustic wave structure is different to that of the fingers in the second surface acoustic wave structure, and/or they are shifted in phase with respect to one another.

In addition to the normal propagation losses, broadband losses occur, due to partial conversion of the surface acoustic wave into volume waves, at the junction between two surface acoustic wave structures which are different or are phase-shifted with respect to one another. The conversion losses in this case increase as the metallization height increases. This is described, for example, in an article by Yasuo Ebata, "SUPPRESSION OF BULK-SCATTERING LOSS IN SAW RESONATOR WITH QUASI-CONSTANT ACOUSTIC REFLECTION PERIODICITY" in Ultrasonics Symposium 1988, pp. 91–96.

This situation occurs, in particular, when the two lattice elements (surface acoustic wave structures) differ in terms of period length, metallization ratio and/or layer thickness, or the distance between the two surface acoustic wave structures is chosen such that the two lattice elements are phase-shifted with respect to one another.

With many filter techniques, such discrepancies from perfect periodicity are essential for the method of operation of the filter (for example: DMS filter). It has thus been proposed, in DE 42 12 517, that the junction between the two surface acoustic wave structures be designed to be quasi-periodic. However, this technique has been found to be sufficiently successful only if the relative difference between the speeds of the surface acoustic wave and the interfering volume wave is considerably greater than the relative useful bandwidth of the filter, as is the case, for example, with narrowband IF filters on quartz. This is the only situation where the interference of the parasitic volume wave with the transfer function is outside the pass band of the filter and thus does not interfere with the filter response.

However, low-loss filters having a broader bandwidth are required for telecommunications networks based on the EGSM Standard or for PCS/PCN.

DMS filters (double mode surface acoustic wave filters) are frequently used as low-loss, broadband filters with high selectivity for RF purposes, for example on a 42° rot YX—$LiTaO_3$ substrate or on a 36° rot YX—$LiTaO_3$.

One example of a simple single-track DMS filter is illustrated schematically in FIG. 1. This filter in this case comprises a track having input transducers E1 and E2, which are arranged between two reflectors R1 and R2, and the output transducer A. The connections for the input and output transducers can also be interchanged, with A then representing the input transducer, and E1, E2 the output transducers. It is also possible to connect the output transducer, or else the output transducers, of this one track to the input transducer, or input transducers, of a second parallel track. This allows the selectivity of the filter to be increased.

DMS filters have two separate resonant frequencies within one acoustic track, which define a transmission band. The left-hand edge of the transmission band is governed by the lattice period, while the right-hand edge comes about due to the resonance between two mutually shifted surface acoustic wave structures (input and output transducers). In comparison to a periodic lattice, these two structures have been shifted through a $\Delta x$ of approximately $\lambda/4$ with respect to one another. The distance $\Delta x$ in this case relates to the finger centers of adjacent (electrode) fingers of the surface acoustic wave structures. In practice, one of the two end fingers is preferably broadened by approximately $\lambda/4$, as is shown in FIG. 1 for the output transducer A at the junction to the two input transducers E1 and E2. This is done in order to fill the gap between the two structures with a metallized surface, since any surface leakage wave is carried better under a metallized surface.

This results in a structure having a greatly broadened finger, which has a considerably greater local lattice period p (defined by the distance between the center points of the two free surfaces to the left and right of the finger) than the other fingers. This represents a considerable disturbance with the periodic lattice. FIG. 2 shows, schematically, the profile of the finger period p in the region of the junction between two such transducer structures (surface acoustic wave structures) plotted against the position coordinate x, the propagation direction of the surface acoustic waves.

In mobile radio systems (for example GSM, nominal bandwidth 25 MHz) which have been used until now, it has admittedly been possible to identify the acoustic losses in the form of volume wave emission at the structure junctions, but this has not been so severely pronounced for the provision of low-loss filters to be possible. However, broader bandwidths will be used in future mobile radio systems, in order to provide more channels (for example EGSM, nominal bandwidth 35 MHz).

Normally, the bandwidth of surface acoustic wave filters is increased by increasing the metallization layer thicknesses and reducing the number of fingers. Both measures increase the losses at the junctions between the structures. In practice, these losses result in a reduction in the Q-factor of the transducer/transducer resonance, which defines the right-hand band edge, and thus in a reduction in the upper pass band range.

Particularly in the case of EGSM filters, the influence of the losses is so great that the reduction in the upper pass band must be compensated for by means of additional, external matching elements. The external matching can admittedly reduce the amount of ripple in the pass band, but a significant remaining disadvantage is the increased insertion loss of such filters resulting from the losses at the junctions. The specification required for EGSM, for example, can also only partially be satisfied. External matching networks are, furthermore, always associated with additional costs, weight, surface area on the circuit and production complexity, and are thus undesirable for most users.

SUMMARY OF THE INVENTION

The object of the present invention is to provide low-loss broadband filters which avoid the above-mentioned disadvantages.

According to the invention, this object is achieved by a surface acoustic wave arrangement comprising a piezoelectric substrate; at least two surface acoustic wave structures, which are fitted on the substrate, are arranged one behind the other in the propagation direction of the surface acoustic waves, comprise metallic fingers and have a first and second finger period; the two surface acoustic finger structures having a different phase and/or different finger period; fingers at the ends of the two surface acoustic wave structures forming a junction region from a first to a second surface acoustic wave structure, and the local finger period of the first surface acoustic wave structure initially decreasing continuously in the junction region and finally rises continuously again until the finger period of the second surface acoustic wave structure is reached.

The junction region is formed by 5 to 8 fingers at the ends of the two surface acoustic wave structures. The surface acoustic wave structures can be two interdigital transducers, or a reflector in combination with an interdigital transducer, or two reflectors. Preferably, the widths of the fingers of the two structure initially decrease and increase in the junction region and the structure having metallization ratio $\eta$ of 0.7 to 0.8.

The arrangement may be a dual mode surface acoustic wave filter (DMS filter), with interdigital transducers which are used as input and output transducers being arranged between two reflectors in one acoustic track, and the surface acoustic wave structures being selected from interdigital transducers and reflectors. The reflectors are connected to the ground. The metallization height of the surface acoustic wave structures is in the region from 9 to 11% of the wavelength, which is associated with the surface acoustic wave structures, of the surface acoustic waves.

The arrangement can have three interdigital transducers which are arranged one behind the other between two reflectors with the central interdigital transducer, which is connected to a first connection, having a total of 27 to 35 electrode fingers and, in contrast, the two outer interdigital transducers, which are connected to a second connection, have a total of 20 to 24 electrode fingers. The distances between the central interdigital transducer and the two outer interdigital transducers are of different magnitude.

The arrangement can be in the form of a two-track arrangement, with the finger periods of the reflectors in the two tracks being of different magnitude. The arrangement can be in the form of a reactance filter with single-port resonators, with a junction between the different finger periods of an interdigital transducer and a reflector in at least one single-port resonator.

The invention results in a reduction in the transmission losses of the filter, which is evident in the improved insertion loss and, in particular, in the upper half of the pass band. The useful bandwidth is thus increased, and there is no need for any external matching networks.

When designing broadband, low-loss surface acoustic wave filters (for example RF filters for EGSM or PCS/PCN on 42° rot YX—$LiTaO_3$), the inventors found that additional losses, in the form of conversion to volume waves, also occur in a quasi-periodic lattice if the local period at the junction is greater than in the two structures on both sides of the junction. In contrast to a hard transition, with an abruptly increased finger period, this conversion does not, however, occur below a characteristic onset frequency, which is inversely proportional to the local period of the lattice.

The losses at the junctions between surface acoustic wave structures with a different phase and/or a different finger period are thus considerably reduced, or entirely avoided, in that, according to the invention, a finger period which is less than the finger period of the adjacent surface acoustic wave structures is used at the junction points. This results in the onset frequency for volume wave emission being above the desired transmission band of the filter. The junction between the surface acoustic wave structures is quasi-periodic, that is to say a quasi-periodic structure is formed in the region of the wave junction between two surface acoustic wave structures, which quasi-periodic structure forms a continuous transition between the finger period p and/or the phase of the final surface acoustic wave structure in that of the second surface acoustic wave structure.

Depending on the extent of the discontinuity at the junction, a quasi-periodic junction region is formed having a sufficiently large number of fingers. A total of 3–4 fingers at the ends of each surface acoustic wave structure has been found to be sufficient to suppress the losses even for very severe discontinuities. The junction region should not necessarily be chosen to be greater than is required to avoid losses since, otherwise, this will have a negative effect on the transmission response of the filter.

The desired junction according to the invention is achieved if the finger period of the first surface acoustic wave structure initially decreases continuously in the junction region and finally rises continuously again until the finger period of the second surface acoustic wave structure is reached.

For the purposes of the invention, the term surface acoustic wave structure covers both interdigital transducers and reflectors. Junctions may therefore occur, and be designed according to the invention, not only between two interdigital transducers, but also between an interdigital transducer and a reflector, and between two reflectors. The invention can thus advantageously be used, in particular, for DMS filters and single-port resonators. In the latter, the reflectors have a different (greater) finger period than the interdigital transducer.

The finger width and the finger spacing are reduced continuously in order to reduce the finger period in the junction region.

The choice of a metallization ratio $\eta$ ($\eta$=ratio of the metallized surface to the unmetallized surface area within one period of the surface acoustic wave structure) between 0.7 and 0.8 reduces the speed of the surface leakage wave, as a result of which the separation between the onset frequency for volume wave conversion and the pass band is further increased. This therefore also reduces the influence of volume wave losses.

Reduced transmission losses are likewise achieved if the reflectors of the surface acoustic wave arrangement are connected to ground, since this results in a considerable reduction in the lossy exchange of charge within the reflector.

The invention will be explained in more detail in the following text, with reference to exemplary embodiments and the drawings.

BRIEF DESCRIPTION OF THE DRAWINGS

FIG. 3 shows the profile of the finger period for a surface acoustic wave arrangement according to the invention.

FIG. 4a shows two surface acoustic wave structures having a hard transition, in which, FIG. 4b a surface acoustic wave arrangement having a junction according to the invention between two surface acoustic wave structures is shown for comparison.

DESCRIPTION OF THE PREFERRED EMBODIMENTS

Figure 1:
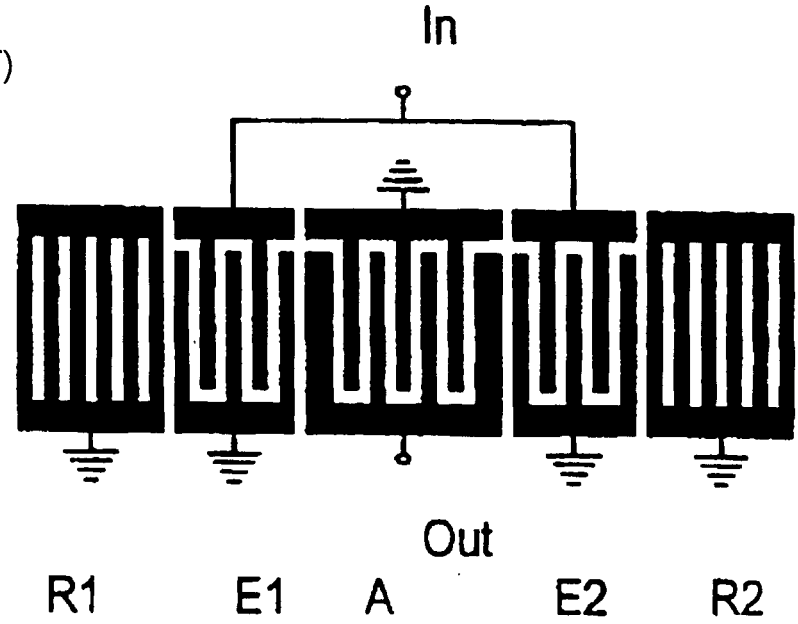
FIG 1 (PRIOR ART)
FIG. 1 shows a known single-track DMS filter.

FIG. 1 shows a known single-track DMS filter, in which two parallel-connected input transducers E1, E2, with an output transducer A between them, are arranged between two reflectors R1 and R2. In and Out denote the electrical connections for the input and output. The finger period p, which is a measure of the distances between the fingers, is defined in the following text as the distance which extends from the center of the free space between two fingers to the center of the next free space between two adjacent fingers. In the illustrated DMS filter, the output transducer A is shifted with respect to the two input transducers E1 and E2, with the finger period in each case having a discontinuity at the E1/A and A/E2 junctions between two mutually shifted transducers.

Figure 2:
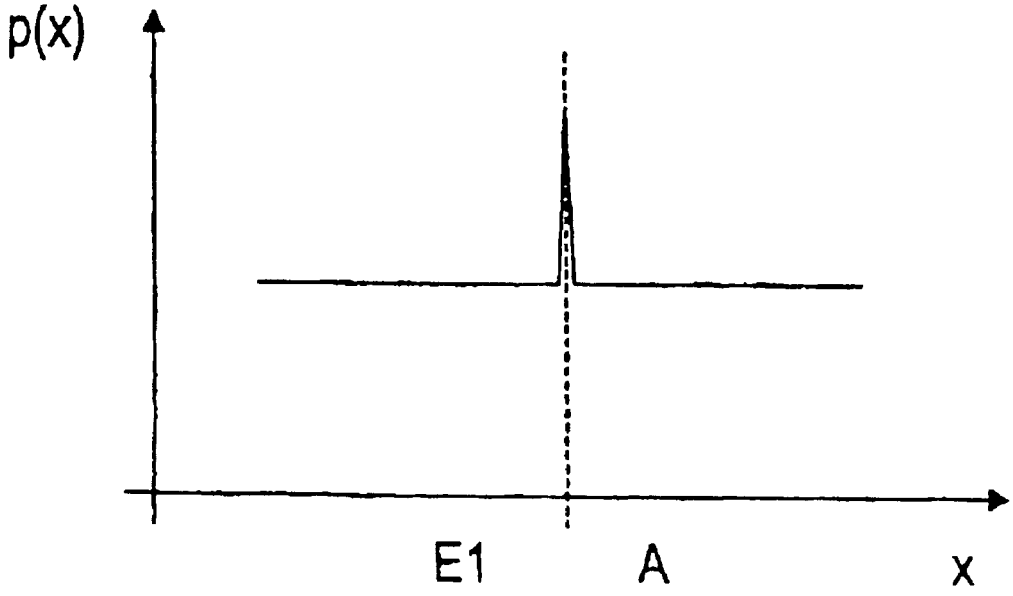
FIG 2 (PRIOR ART)
FIG. 2 shows the profile of the finger period of the known filter (see FIG. 1) along the position coordinate.

FIG. 2 shows the profile of the finger period of these transducers in the region of the junction between transducer E1 and the transducer A. The shift of the two transducers with respect to one another is expressed in an abruptly rising finger period which then falls, likewise abruptly, once again to a constant value. The same hard transition can be seen between the two transducers A and E2 which have been shifted with respect to one another. The two outer end fingers of the transducer A have been broadened in order to fill the gap between the two structures with a metallized surface. The disadvantages which result from such a discontinuity in the profile of the finger period at the junction between two surface acoustic wave structures (in this case two transducers) have already been explained in the introduction.

FIG. 3 shows the profile of the finger period p for a surface acoustic wave arrangement according to the invention, in the region of the junction between a first surface acoustic wave structure St1 and a second surface acoustic wave structure St2. The finger period p varies continuously in the region of the junction, where it also has a lower value than in either of the two structures St1 or St2. Outside the junction region, that is to say within the two structures St1 and St2, the finger period assumes a constant value, which may differ from one surface acoustic wave structure to another surface acoustic wave structure. The surface acoustic wave structure may in this case be an interdigital transducer or a reflector, in which case the junction may occur between a transducer and a transducer, or between a transducer and a reflector.

FIG. 4 uses an exemplary embodiment to show how the junction between two mutually shifted surface acoustic wave structures St1 and St2 may be configured according to the invention. For comparison, FIG. 4a shows a known hard transition, as has already been described with reference to FIG. 1. In this case, one of the two boundary fingers has been broadened. FIG. 4b shows the junction designed according to the invention. The finger period p has in this case been reduced continuously over the last three fingers of the structure St1, and likewise rises continuously once again over the outermost three fingers in the adjacent structure St2. This arrangement considerably reduces the scattering losses at the junction between the two structures, in comparison to a known arrangement with a hard transition.

Furthermore, a junction designed according to the invention and, for example, as shown in FIG. 4b, is simple to manufacture since neither the finger widths nor the finger spacings differ too severely from "normal" finger widths and finger spacings.

Figure 5:
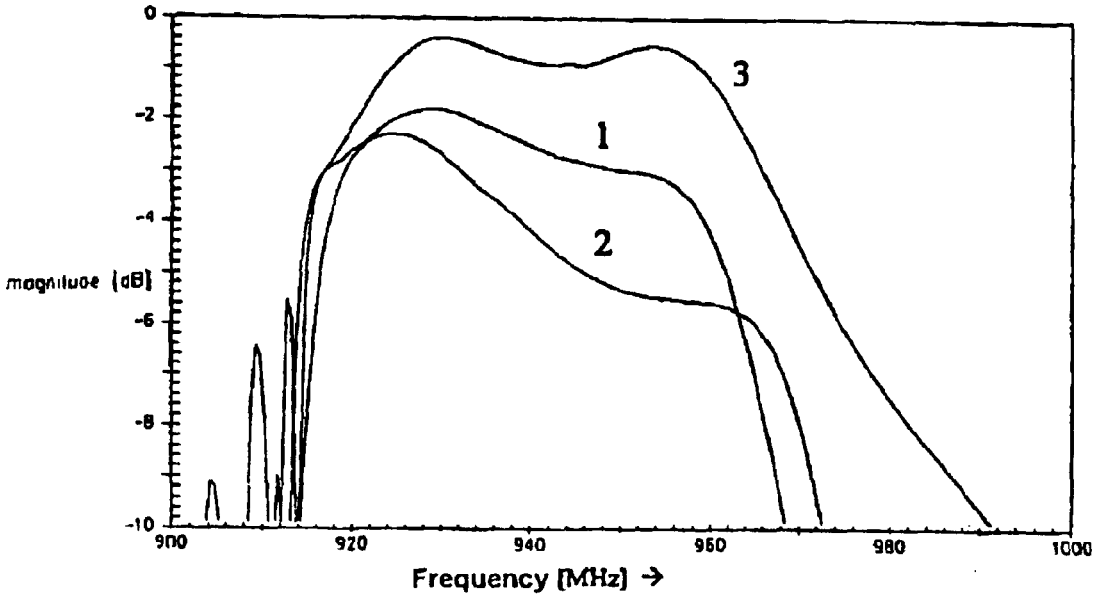
FIG. 5 is a graph showing a comparison of the pass characteristic of filters according to the invention and known filters, based on measured curves.

FIG. 5 shows the transmission curves for three surface acoustic wave filters which have surface acoustic wave structures that have been shifted with respect to one another. The DMS filter illustrated in FIG. 1 is used as an example, whose transmission response is shown by the transmission curve 1 in FIG. 5. The transmission curve 2 is obtained for a DMS filter as shown in FIG. 1, but having a continuous finger period profile. In this structure, the finger at the end is not broadened, but the greater separation between the two structures on both sides of the junction is distributed over the respective outermost three fingers, so that a locally increased finger period occurs at the junction. As can clearly be seen from the measured curve 2, a DMS filter designed in this way has an even worse transmission response than the filter shown in FIG. 1. The transmission curve 3, on the other hand, was measured with a DMS filter designed according to the invention, in which the finger period in the region of the junction of the two mutually shifted transducers (surface acoustic wave structures) has been reduced, with an additional finger being inserted, in comparison to the SAW filter which is known from FIG. 1. In this case, both the finger width and the finger spacing decrease continuously toward the junction, in both transducers. As FIG. 5 shows, such a filter designed according to the invention has a better transmission response, which is indicated by reduced attenuation and a more uniform transmission curve. The reduced attenuation, particularly in the region of the right-hand edge of the transmission curve, is achieved by the reduced scattering losses in the region of the junction.

Further parameters for designing DMS filters are specified as an exemplary embodiment in the following text, these being suitable for the EGSM system which has a nominal bandwidth of 35 MHz at a mid-frequency of 942.5 MHz.

Lithium tantalate $LiTaO_3$ with a 42° rot YX crystal cut is used as the substrate. The metallization for the surface acoustic wave structures is applied with a thickness which amounts to 9 to 11 percent of the associated wavelength, for example 420 nm. This provides the required bandwidth of 35 MHz. The right-hand flank of the transmission curve of the filter, which is a result of the resonance between two transducers shifted through a value $\Delta x$ with respect to one another, can be said to comply with the EGSM Specifications by selecting $\Delta x=(0.25\pm0.05)\lambda$. The quasi-periodic transition of the finger period between the two shifted transducers can be distributed over a total of five to eight fingers. The total number of electrode fingers in transducer A (see FIG. 1) is preferably chosen to be in the range from 27 to 35, and the total number of fingers in the transducers E1 and E2 to be in the range from 20 to 24. This results in a filter which is optimized in terms of ripple and flank gradient.

The selectivity required for EGSM is obtained with a filter having two tracks whose junction is designed according to the invention. The aperture is chosen to be between $50\times\lambda$ and $70\times\lambda$, in order to obtain input and output impedances of 50Ω.

The entire filter with a surface acoustic wave arrangement according to the invention may also be used in embodiments which can be operated symmetrically/asymmetrically. This means, inter alia, a filter in which an asymmetric signal is present at the input or at the output, that is to say in which one of the two connections is carrying a signal, while the other is connected to ground. At the other end of the filter, a symmetrical signal is present at the two connections, which has the same absolute amplitude at both connections, but with the opposite mathematical sign, or a phase difference of 180°.

A further application of the invention is in DMS filters which can be operated symmetrically/asymmetrically and in which the input and output impedance differ. The input or output impedance can be adjusted by weighting or by vertical or horizontal splitting of the transducers into transducer element structures, as is proposed, for example, in the two prior German Patent Applications 197 24 258.8 and 197 24 259.6.

It is also possible for the distances between the central interdigital transducer (A) and the two outer interdigital transducers (E1, E2) to be of different magnitude.

A further refinement relates to a filter which is in the form of a two-track arrangement, with the finger periods p of the reflectors (R) in the two tracks being of different magnitude.

The invention can likewise be used in a resonator filter in which the junction between a mutually shifted transducer and reflector is designed according to the invention. For example, a reactance filter comprising a number of single-port resonators connected in series and/or in parallel and having a junction between the different finger periods (p) of the interdigital transducer and reflector can be formed in at least one single-port resonator.

What is claimed is:

1. A surface acoustic wave arrangement comprising a piezoelectric substrate; at least two surface acoustic wave structures being fitted on the substrate, said structures being arranged one behind the other in a propagation direction of the surface acoustic waves and having metallic fingers with a first and second finger period, said two surface acoustic wave structures having differences selected from different phase, different finger period, and a combination of different phase and different finger period; fingers at the ends of the two surface acoustic wave structures forming a junction region from a first of the two surface acoustic wave structures to a second of the two surface acoustic wave structures, the local finger period of the first surface acoustic wave structure initially decreasing continuously in the junction region and finally rising continuously again until the finger period of the second surface acoustic wave structure is reached.

2. A surface acoustic wave arrangement according to claim 1, wherein the junction region is formed by 5 to 10 fingers and the ends of the two surface acoustic wave structures.

3. A surface acoustic wave arrangement according to claim 1, wherein at least one of the two surface acoustic wave structures is in the form of an interdigital transducer.

4. A surface acoustic wave arrangement according to claim 3, wherein a second surface acoustic wave structure is in the form of a reflector.

5. A surface acoustic wave arrangement according to claim 1, wherein the two surface acoustic wave structures are in the form of reflectors.

6. A surface acoustic wave arrangement according to claim 1, wherein the width of the fingers of the surface acoustic wave structure initially decreases and then increases again in the junction region.

7. A surface acoustic wave arrangement according to claim 1, wherein the surface acoustic structure has a metallization ratio $\eta$ of 0.7 to 0.8.

8. A surface acoustic wave arrangement according to claim 1, wherein the arrangement is in the form of a dual mode surface acoustic wave filter with interdigital transducers which are used as input and output transducers being arranged between two reflectors in one acoustic track, the surface acoustic wave structures being selected from interdigital transducers and reflectors.

9. A surface acoustic wave arrangement according to claim 8, wherein the reflectors are connected to ground.

10. A surface acoustic wave arrangement according to claim 8, wherein a metallization height of the surface acoustic wave structures is in a range of 9 to 11% of the wavelength of the surface acoustic wave structures.

11. A surface acoustic wave arrangement according to claim 1, wherein the substrate is selected from a 42° rot YX—$LiTaO_3$ substrate and a 36° rot YX—$LiTaO_3$ substrate.

12. A surface acoustic wave arrangement according to claim 11, which includes three interdigital transducers which are arranged one behind the other between two reflectors with the central interdigital transducer being connected to a first connection *and* having a total of 27 to 35 electrode fingers and the two outer interdigital transducers being connected to a second connection and having a total of 20 to 24 electrode fingers.

13. A surface acoustic wave arrangement according to claim 12, wherein a distance between the central interdigital transducer and the two outer interdigital transducers are of different magnitude.

14. A surface acoustic wave arrangement according to claim 1, which is in the form of a two-track arrangement, *each track having at least one reflector,* with the finger periods of the reflectors [and] *in* the two tracks being of different magnitude.

15. A surface acoustic wave arrangement according to claim 1, which is in the form of a reactance filter with single-port resonators with a junction between the different finger periods of the interdigital transducer and a reflector in at least one single-port resonator.

*16. A surface acoustic wave arrangement comprising a piezoelectric substrate; at least two surface acoustic wave structures being fitted on the substrate, said structures being arranged one behind the other in a propagation direction of the surface acoustic waves and having metallic fingers with a first and second finger period, said two surface acoustic wave structures having differences selected from different phase, different finger period, and a combination of different phase and different finger period; fingers at the ends of the two surface acoustic wave structures forming a junction region from a first of the two surface acoustic wave structures to a second of the two surface acoustic wave structures, the junction region having a finger period less than the finger period of the adjacent surface acoustic wave structures.*

*17. A surface acoustic wave arrangement according to claim 16, wherein the junction region is formed by 5 to 10 fingers and the ends of the two surface acoustic wave structures.*

*18. A surface acoustic wave arrangement according to claim 16, wherein at least one of the two surface acoustic wave structures is in the form of an interdigital transducer.*

*19. A surface acoustic wave arrangement according to claim 18, wherein a second surface acoustic wave structure is in the form of a reflector.*

*20. A surface acoustic wave arrangement according to claim 16, wherein the two surface acoustic wave structures are in the form of reflectors.*

*21. A surface acoustic wave arrangement according to claim 16, wherein the width of the fingers of the surface acoustic wave structure initially decreases and then increases again in the junction region.*

*22. A surface acoustic wave arrangement according to claim 16, wherein the surface acoustic structure has a metallization ratio η of 0.7 to 0.8.*

*23. A surface acoustic wave arrangement according to claim 16, wherein the arrangement is in the form of a dual mode surface acoustic wave filter with interdigital transducers which are used as input and output transducers being arranged between two reflectors in one acoustic track, the surface acoustic wave structures being selected from interdigital transducers and reflectors.*

*24. A surface acoustic wave arrangement according to claim 23, wherein the reflectors are connected to ground.*

*25. A surface acoustic wave arrangement according to claim 23, wherein a metallization height of the surface acoustic wave structures is in a range of 9 to 11% of the wavelength of the surface acoustic wave structures.*

*26. A surface acoustic wave arrangement according to claim 16, wherein the substrate is selected from a 42° rot YX—$LiTaO_3$ substrate and a 36° rot YX— $LiTaO_3$ substrate.*

*27. A surface acoustic wave arrangement according to claim 16, which includes three interdigital transducers which are arranged one behind the other between two reflectors with the central interdigital transducer being connected to a first connection and having a total of 27 to 35 electrode fingers and the two outer interdigital transducers being connected to a second connection and having a total of 20 to 24 electrode fingers.*

*28. A surface acoustic wave arrangement according to claim 27, wherein a distance between the central interdigital transducer and the two outer interdigital transducers are of different magnitude.*

*29. A surface acoustic wave arrangement according to claim 16, which is in the form of a two-track arrangement, each track having at least one reflector, with the finger periods of the reflectors in the two tracks being of different magnitude.*

*30. A surface acoustic wave arrangement according to claim 16, which is in the form of a reactance filter with single-port resonators with a junction between the different finger periods of the interdigital transducer and a reflector in at least one single-port resonator.*

* * * * *